(12) United States Patent
Nakanishi et al.

(10) Patent No.: US 9,101,048 B2
(45) Date of Patent: Aug. 4, 2015

(54) PRINTED WIRING BOARD AND METHOD OF MANUFACTURING PRINTED WIRING BOARD

(71) Applicant: SHINKO ELECTRIC INDUSTRIES CO., LTD., Nagano (JP)

(72) Inventors: Tsukasa Nakanishi, Nagano (JP); Atsushi Nakamura, Nagano (JP); Takayuki Matsumoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 186 days.

(21) Appl. No.: 13/742,669

(22) Filed: Jan. 16, 2013

(65) Prior Publication Data

US 2013/0192880 A1    Aug. 1, 2013

(30) Foreign Application Priority Data

Jan. 30, 2012    (JP) ................. 2012-016710

(51) Int. Cl.
| | |
|---|---|
| H05K 1/00 | (2006.01) |
| H05K 1/11 | (2006.01) |
| H05K 7/20 | (2006.01) |
| H05K 1/02 | (2006.01) |
| H05K 3/00 | (2006.01) |
| H01L 25/075 | (2006.01) |

(52) U.S. Cl.
CPC .......... *H05K 1/0201* (2013.01); *H05K 1/0206* (2013.01); *H05K 3/00* (2013.01); *H01L 25/0753* (2013.01); *H01L 2224/48091* (2013.01); *H01L 2224/73265* (2013.01); *H05K 1/0209* (2013.01); *H05K 1/113* (2013.01); *H05K 3/0061* (2013.01); *H05K 2201/099* (2013.01); *H05K 2201/10106* (2013.01); *H05K 2203/0733* (2013.01); *Y10T 29/49155* (2015.01)

(58) Field of Classification Search
USPC .......... 174/252, 262–266; 361/713, 714, 719, 361/720; 257/713
See application file for complete search history.

(56) References Cited

U.S. PATENT DOCUMENTS

| | | | |
|---|---|---|---|
| 6,045,240 A | | 4/2000 | Hochstein |
| 6,156,980 A | * | 12/2000 | Peugh et al. ................... 174/252 |
| 6,205,028 B1 | * | 3/2001 | Matsumura .................... 361/720 |

(Continued)

FOREIGN PATENT DOCUMENTS

| | | |
|---|---|---|
| DE | 8114325.7 U1 | 9/1982 |
| JP | 2003-092011 | 3/2003 |
| WO | WO 2005/001943 | 1/2005 |

OTHER PUBLICATIONS

Extended European Search Report dated May 31, 2013 issued with respect to the corresponding European Patent Application No. 13152287.2.

*Primary Examiner* — Timothy Thompson
*Assistant Examiner* — Sherman Ng
(74) *Attorney, Agent, or Firm* — IPUSA, PLLC

(57) ABSTRACT

A printed wiring board includes an insulative substrate, a wiring portion which is formed on a surface of the insulative substrate and has a predetermined wiring pattern, an insulative layer which is formed on the wiring portion and on which a part of the wiring layer is exposed as a terminal, a radiator plate provided on another surface of the insulative substrate, and a heat conductive portion which is formed inside the through hole penetrating through the surface and the other surface of the insulative substrate and connected to the wiring portion.

12 Claims, 17 Drawing Sheets

(56) References Cited

U.S. PATENT DOCUMENTS

| | | | |
|---|---|---|---|
| 6,411,516 B1* | 6/2002 | Palumbo et al. | 361/704 |
| 6,434,818 B2* | 8/2002 | Kanechika et al. | 29/846 |
| 6,671,176 B1* | 12/2003 | Barcley | 361/719 |
| 6,857,767 B2 | 2/2005 | Matsui et al. | |
| 2002/0172025 A1* | 11/2002 | Megahed et al. | 361/767 |
| 2004/0190273 A1* | 9/2004 | Chen et al. | 361/782 |
| 2005/0236180 A1* | 10/2005 | Sarma et al. | 174/256 |
| 2006/0109632 A1* | 5/2006 | Berlin et al. | 361/719 |
| 2006/0131732 A1* | 6/2006 | Nah et al. | 257/706 |
| 2006/0181878 A1 | 8/2006 | Burkholder | |
| 2007/0242462 A1 | 10/2007 | Van Laanen et al. | |
| 2008/0081161 A1* | 4/2008 | Tomita et al. | 428/209 |
| 2008/0099770 A1 | 5/2008 | Mendendorp et al. | |
| 2008/0185607 A1 | 8/2008 | Park | |
| 2009/0103302 A1* | 4/2009 | Lin et al. | 362/257 |

* cited by examiner

PRINTED WIRING BOARD AND METHOD OF MANUFACTURING PRINTED WIRING BOARD

CROSS-REFERENCE TO RELATED APPLICATION

This patent application is based upon and claims the benefit of priority of the prior Japanese Patent Application No. 2012-016710 filed on Jan. 30, 2012, the entire contents of which are incorporated herein by reference.

FIELD

The embodiments discussed herein are related to a printed wiring board and a method of manufacturing the printed wiring board.

BACKGROUND

There is an exemplary lighting device formed by mounting plural LED groups including plural light emitting diodes (LEDs) on a wiring pattern provided on a front surface of a substrate having flexibility and mounting plural radiator plates on a back surface opposite to the front surface on which the plural LED groups are mounted as disclosed in, for example, Japanese Laid-open Patent Publication No. 2003-092011.

The plural radiator plates are bonded to the substrate by an adhesive so as to cover portions corresponding to mounting positions of the plural LED groups.

As described, the exemplary lighting device is formed by mounting the LEDs on the printed wiring board including the substrate, a wiring pattern (wiring portions), and a radiator plate.

SUMMARY

According to an aspect of the embodiment, a printed wiring board includes an insulative substrate, a wiring portion which is formed on a surface of the insulative substrate and has a predetermined wiring pattern, an insulative layer which is formed on the wiring portion and on which a part of the wiring layer is exposed as a terminal, a radiator plate provided on another surface of the insulative substrate, and a heat conductive portion which is formed inside the through hole penetrating through the surface and the other surface of the insulative substrate and connected to the wiring portion The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

However, in the printed wiring board of the exemplary lighting device, the wiring portions are connected to the radiator plate via the substrate. The substrate is made of a resin having a low heat conductivity (for example, fiber-glass reinforced plastic).

Therefore, there is a problem that heat generated by electronic parts generating heat such as LEDs is not efficiently conducted to the radiator plates on the back surface of the substrate from the wiring portions on the front surface of the substrate.

Preferred embodiments of the present invention will be explained with reference to accompanying drawings.

[a] First Embodiment

Figure 1:
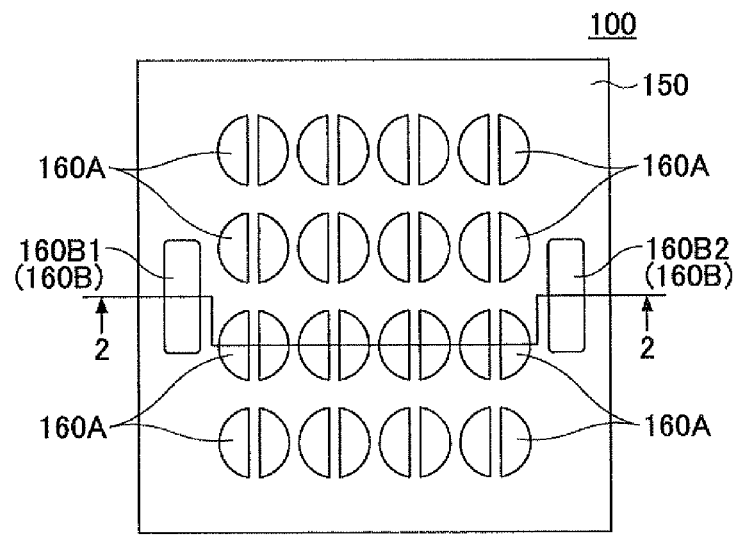
FIG. 1 is a plan view of a printed wiring board of a first embodiment.
Figure 2:
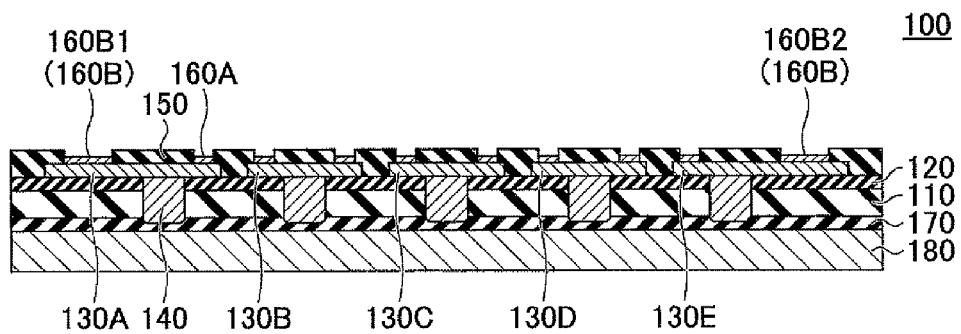
FIG. 2 is a cross-sectional view of the printed wiring board of the first embodiment.

FIG. 1 is a plan view of a printed wiring board of the first embodiment. FIG. 2 is a cross-sectional view of the printed wiring board of the first embodiment. The cross-sectional view illustrated in FIG. 2 is taken along a line 2-2 of FIG. 1.

The printed wiring board 100 of the first embodiment includes a substrate 110, adhesive layer 120, wiring portions 130, heat conductive portions 140, an insulating layer 150, plating layers 160A, 160B, 160B1, and 160B2, an adhesive layer 170, and a radiator plate 180.

Figure 3:
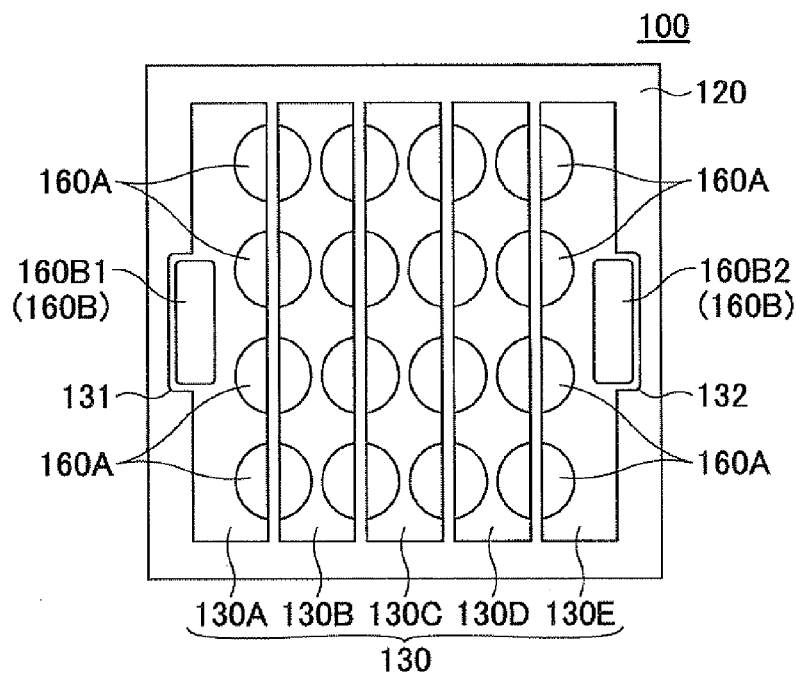
FIG. 3 is a plan view from which an insulating layer is removed from a printed wiring board.

Referring to FIG. 1, the plating layers 160A, 160B1, and 160B2 are exposed on the insulating layer 150. FIG. 3 is a plan view from which the insulating layer 150 is removed from the printed wiring board 100 illustrated in FIG. 1. Referring to FIG. 3, this state does not exist in a process of manufacturing the printed wiring board 100 to be described later. However, FIG. 3 is illustrated in order to facilitate understanding of the printed wiring board 100 illustrated in FIG. 1 without the insulating layer 150. Thus, positional relationships among the adhesive layer 120, the wiring portions 130, and the plating layers 160A, 160B1, and 160B2 are illustrated without the insulating layer 150.

For example, the substrate 110 is preferably made of a polyimide tape, which is an insulative resin film. The polyimide tape is an example of insulative substrates. The polyimide tape has flexibility. Further, because the polyimide tape is a tape-like film made of polyimide, the polyimide tape can be preferably used to dice the tape-like film to make plural printed wiring boards 100 after forming the plural printed wiring boards 100.

However, the substrate 110 may be made of not only the polyimide tape but also an insulative resin film made of a different type of the insulative resin film. For example, a film made of an epoxy resin or a polyester resin may be used.

However, the substrate 110 is not limited to the polyimide tape or the insulative substrate having flexibility. For example, the substrate 110 may be made of a glass epoxy resin according to the standard of Flame Retardant 4 (FR4).

The thickness of the substrate is, for example, 50 μm to 125 μm.

The adhesive layer 120 is attached to the front surface (i.e., an upper surface in FIG. 2) of the substrate 110. The wiring portions 130 are bonded to the substrate 110 by the adhesive layer 120. The adhesive layer 120 may be made of, for example, a heat resistant resin such as an epoxy adhesive or a polyimide adhesive. The thickness of the adhesive layer 120 is, for example, 8 μm to 12 μm.

The wiring portions 130 are bonded to the surface of the substrate 110 by the adhesive layer 120 and are patterned to be a predetermined pattern. FIG. 3 illustrates five wiring portions 130A to 130E patterned to be in a stripe-like shape. Among the wiring portions 130A to 130E, the wiring portions 130A and 130E on the side ends include protrusions 131 and 132, respectively.

The wiring portions 130 are shaped like a ruler or a rectangle in their plan views. The plural wiring portions 130 are formed so that long sides of the plural wiring portions 130 face one another with interposing predetermined gaps. The plural wiring portions 130 are arranged in parallel so that long sides of long and thin portions face one another.

The wiring portions 130A to 130E are formed under the plating layers 160A, 160B1, and 160B2 as illustrated in FIG. 2.

For example, the wiring portions 130A to 130E may be formed by patterning a copper foil attached to the surface of the substrate 110 by the adhesive layer 120.

The lengths of the wiring portions 130A to 130E are, for example, 5.0 mm to 10.00 mm. The widths of the wiring portions 130A to 130E are, for example, 0.5 mm to 1.0 mm. The thicknesses of the wiring portions 130A to 130E are, for example, 18 μm to 35 μm.

Hereinafter, if the wiring portions 130A to 130E are not independently distinguished, the wiring portions 130A to 130E are integrally referred to as the wiring portion 130.

The heat conductive portions 140 are shaped like columns (posts) formed inside through holes of the substrate 110 from the back surface to the front surface. The through holes also penetrate the adhesive layer 120. The upper ends of the heat conductive portions 140 are connected to the wiring portions 130. The lower ends of the heat conductive portions 140 are connected to the radiator plate 180 via the adhesive layer 170. The shapes of the heat conductive portions 140 in its plan views are circular. Said differently, the heat conductive portions 140 are conductive and shaped like cylindrical columns.

The heat conductive portions 140 are, for example, copper column-shaped members. The heat conductive portions 140 are formed by growing plating metal inside the through holes of the substrate 110 by electro plating. The diameter of the heat conductive portions 140 are, for example, 0.2 mm to 0.8 mm. The shapes of the heat conductive portions 140 in their plan views are not limited to circles and may be ellipses, rectangles, polygons or the like. Therefore, the heat conductive portions are not limited to be shaped like cylindrical columns, and may be shaped like rectangular columns.

Figure 4:
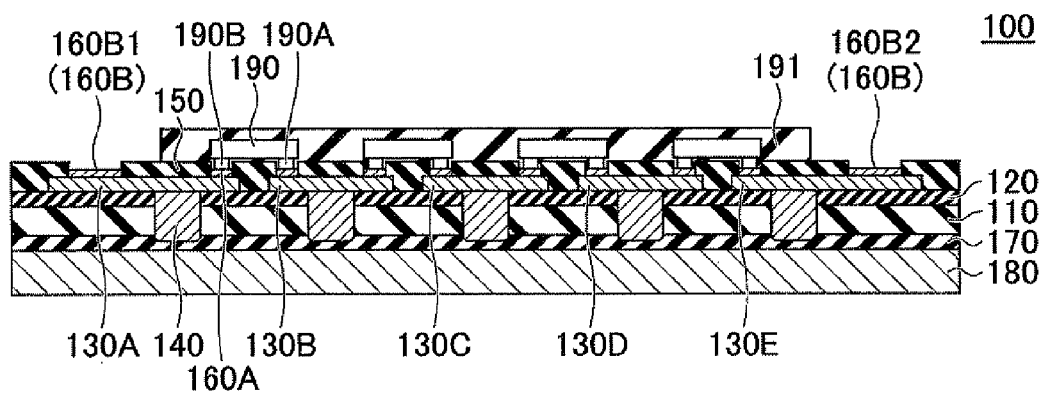
FIG. 4 is a cross-sectional view of the printed wiring board of the first embodiment on which LEDs are mounted.

The front surfaces of the heat conductive portions 140 in FIG. 4 are connected to the wiring portions 130. The back surfaces of the heat conductive portions 140 in FIG. 4 are exposed on the back surface of the substrate 110. For example, the back surfaces of the heat conductive portions 140 protrude from the back surfaces of the substrate 110 and face the radiator plate 180 via the adhesive layer 170.

The back surfaces of the heat conductive portions and the back surface of the substrate 110 may be leveled. Instead, the back surfaces of the heat conductive portions may be set back from the back surface of the substrate 110 toward the insides of the through holes.

The positions of the heat conductive portions 140, the detailed shapes of the conductive portions 140 or the like may be described later with reference to FIGS. 5-7.

The insulating layer 150 is formed so as to cover portions of the front surface of the adhesive layer 120 which are not covered by the wiring portions 130 in FIG. 2 and portions of the front surfaces of the wiring portions 130 which are not covered by the plating layers 160A, 160B1, and 160B2 in FIG. 2.

For example, the insulating layer 150 is a white-colored insulative resin in a case where an electronic part having luminescent and thermogenetic properties such as a LED is mounted on or above the insulating layer 150 using the plating layer 160A of the printed wiring board of the first embodiment. By making the color of the insulating layer 150 white, it is possible to improve the reflectance and the heat radiation rate of the insulating layer 150. Further, it is also possible to improve the illumination intensity and the heat radiation property. Said differently, the insulating layer 150 functions as a reflective film.

The insulative resin forming the insulating layer 150 may be obtained by adding a filler or a pigment such as titanium oxide ($TiO_2$) or barium sulfate ($BaSO_4$) to, for example, an epoxy resin or a silicone resin such as organopolysiloxane. The insulative resin of the insulating layer 150 may be a white ink made of the material of the insulative resin.

The insulating layer 150 may be configured to electrically insulate portions of the front surfaces of the wiring portions 130 on which the plating layers 160A, 160B1, and 160B2 are not formed in FIG. 2. Various insulating layers other than a white-colored ink layer depending on the types of the electronic part connected to the plating layers 160A.

The insulating layer 150 is formed so as to expose areas of the wiring portions 130, on which the plating layers 160A, 160B1, and 160B2 are formed, before the plating layers 160A, 160B1, and 160B2 are formed.

The plating layers 160A are formed on the portions of the front surfaces of the wiring portions, which are not covered by the insulating layer 150. The plating layers 160A are used as electrodes for connecting terminals of the electronic parts.

Referring to FIGS. 1 and 3, plating layers 160A which are equal to 32 are illustrated. The plating layers 160A are formed inside semicircle areas in these plan views. The plating layers 160A which are equal to 32 are arranged to form circles which are equal to 16. A pair of plating layers 160A forming the circles which are equal to 16 are formed on different wiring portions 130A to 130E (see FIG. 3). Therefore, the plating layers 160A which are equal to 8 (partly illustrated in their cross-sectional views) constitute four pairs in each of the wiring portions 130A to 130E.

For example, the positive terminal and the negative terminal are respectively connected to the pair of plating layers 160A. For example, referring to FIGS. 1 and 3, the negative terminal of the electronic part is connected to the left terminal of the pair of plating layers 160A, and the positive terminal of the electronic part is connected to the right terminal of the pair of plating layers 160A.

By connecting as such, the electronic parts which are equal to 4, which are connected to the plating layers 160A which are equal to 8 arranged in the lateral direction in FIGS. 1 and 3, are connected in series. Further, the electronic parts which are equal to 4 can be connected in parallel.

Referring to FIGS. 1 and 3, the plating layers 160B1 and 160B2 are provided in protrusions 131 and 132 of the wiring portions 130A and 130E, respectively. The plating layers 160B1 and 160B2 are used as a pair of electrodes connected to a power source when electric power is supplied to the electronic parts connected to the plating layers 160A. Said differently, one of the pair of plating layers 160B1 and 160B2 is connected to the positive terminal of the power source, and the othe pair of plating layers 160B1 and 160B2 is connected to the negative terminal of the power source. Thus, the electric power is supplied to the electronic parts connected to the pair of plating layers 160A which are equal to 16 pairs.

Hereinafter, if the plating layers 160B1 and 160B2 are not independently distinguished, the plating layers 160B1 and 160B2 are integrally referred to as the plating layers 160B.

The adhesive layer 170 is attached to the back surface (i.e., a lower surface in FIG. 2) of the substrate 110. The radiator plate 180 is bonded to the substrate 110 by the adhesive layer 170. It is preferable that the adhesive layer 170 has high heat conductivity. The adhesive layer 170 may be a heat radiation bond in which a filler such as alumina is contained in an insulative resin such as an epoxy resin or a polyimide resin.

The radiator plate 180 is a heat spreader attached to the back surface of the substrate 110 by the adhesive layer 170. The radiator plate 180 is, for example, a metallic plate made of a metallic material such as aluminum, copper, or the like; ceramics such as alumina, aluminum nitride or the like; or an insulating plate made of an insulating material having high heat conductivity such as silicon or the like.

FIG. 4 illustrates a light-emitting device formed by mounting LEDs 190 on the printed wiring board 100 of the first embodiment. FIG. 4 is a cross-sectional view of the printed wiring board 100 of the first embodiment on which LEDs 190 are mounted. The cross-sectional view illustrated in FIG. 4 corresponds to the cross-sectional view illustrated in FIG. 2.

Referring to FIG. 4, each LED 190 is connected to the corresponding one of the four pairs of the plating layers 160A which are equal to 8. The LEDs 190 include electrodes (not illustrated). The terminals 190A and 190B made of bumps of solder, gold or the like are provided on the electrodes. The LEDs 190 are connected to the wiring portions 130 via the plating layers 160A and the terminals 190A and 190B.

The terminals 190A and 190B of the LEDs 190 which are equal to 4 are respectively connected to the four pairs of the plating layers 160A which are equal to 8. The plating layers 160A may be connected to the terminals 190A and 190B by solder or the like.

The LEDs 190 are sealed by a encapsulating resin 191. The encapsulating resin 191 may be formed by, for example, fluorescent material. The material of the fluorescent material may be determined based on a relationship between the fluorescent material and the luminescent color of the LED 190. For example, if a white luminescent color is to be obtained by the light-emitting device formed by mounting the LEDs 190 and the encapsulating resin 191 on the printed wiring board 100, for example, the LEDs 190 emitting blue light are used and the material of the encapsulating resin 191 is fluorescent material having luminescent colors of green and red.

For example, the encapsulating resin 191 may be formed by adding fluorescent material to a silicone resin or an epoxy resin. The LEDs 190 are sealed by molding or potting using the above-mentioned resin.

Referring to FIG. 4, the heat conductive portions 140 are provided immediately below the portions of the wiring portions 130 to which the terminals of the LEDs 190 are connected (portions of the plating layers 160). Therefore, a path for radiating heat is shortened to thereby improve a heat radiation property.

However, the positions of the heat conductive portions 140 are not limited to the positions immediately below the portions of the wiring portions 130 (the portions of the plating layers 160) to which the terminals 190A and 190B of the LEDs 190 are connected.

Referring to FIG. 4, the four LEDs 190 are integrally sealed by the encapsulating resin 191. The encapsulating resin 191 may be provided for each LED 190 or a group of some of the LEDs 190.

Figure 5:
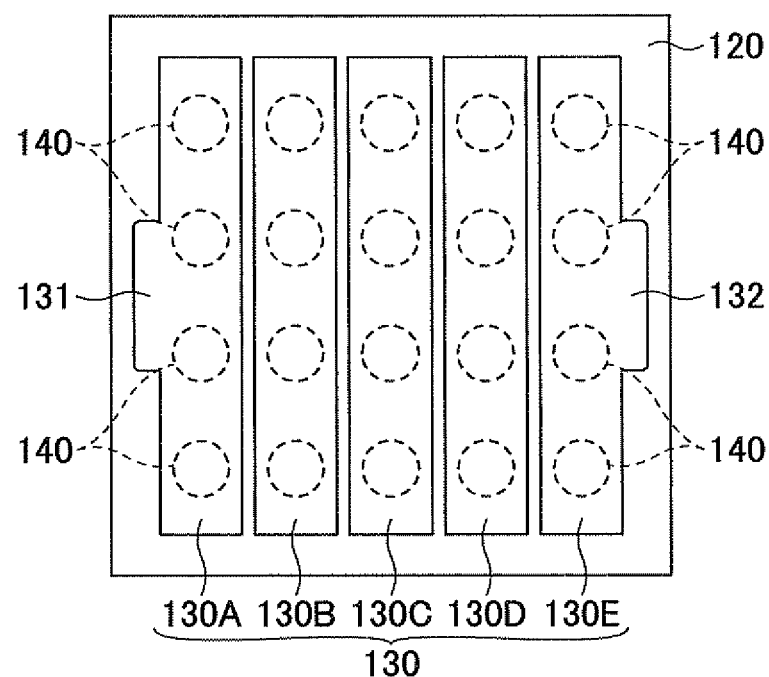
FIG. 5 illustrates the position, the size and the shape of a heat conductive portion on the printed wiring board 100 of the first embodiment.
Figure 6:
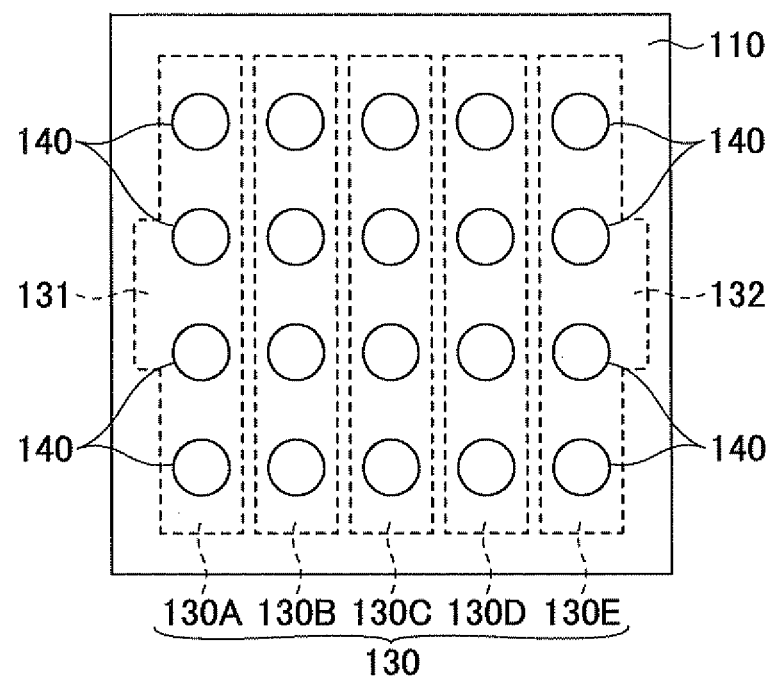
FIG. 6 illustrates the position, the size and the shape of the heat conductive portion on the printed wiring board of the first embodiment.
Figure 7:
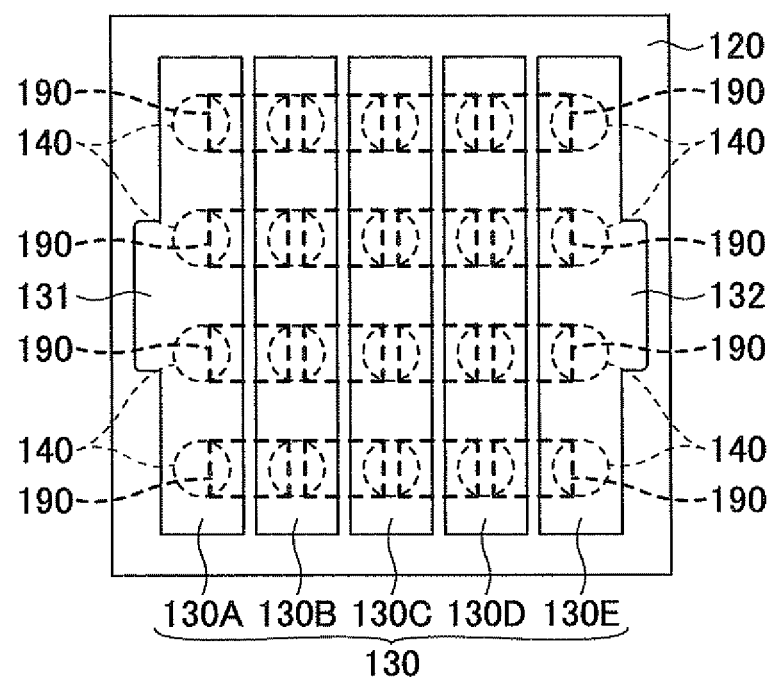
FIG. 7 illustrates the position, the size and the shape of the heat conductive portion on the printed wiring board of the first embodiment.

FIG. 5 to FIG. 7 illustrate the positions, the sizes and the shapes of the heat conductive portions 140 on the printed wiring board 100 of the first embodiment.

Referring to FIG. 5, the insulating layer 150 and the plating layers 160A and 160B are removed from FIG. 1. FIG. 6 is a bottom view of the printed wiring board 100 from which the adhesive layer 170 and the radiator plate 180 are removed. Referring to FIG. 6, the adhesive layer 170 and the radiator plate 180 are not attached to the back surface of the substrate 110 yet. FIG. 7 illustrates positions where the LEDs 190 are attached on FIG. 5.

Figure 20:
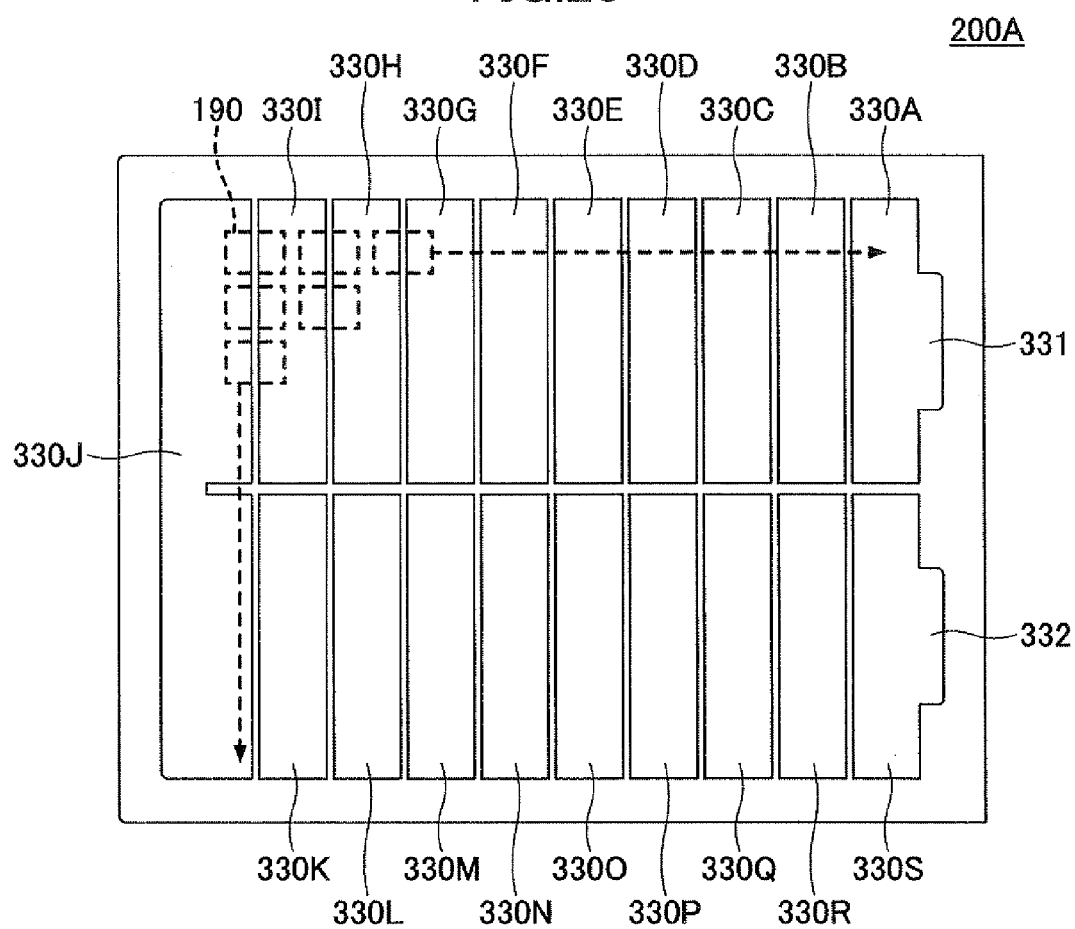
FIG. 20 is a cross-sectional view of the wiring pattern of a printed wiring board of a modified example of the second embodiment.

Referring to FIGS. 5 and 6, 20 heat conductive portions 140, i.e., 5 in the lateral directions and 4 in the longitudinal directions, are arranged. The heat conductive portions 140 which are equal to 4 are connected to each of the wiring portions 130A to 130E which are equal to 5 in stripe-like shapes. The heat conductive portions 140 are positioned inside the area of the wiring portions 130A to 130E in the plan view and the bottom view of the printed wiring board 100. Referring to FIG. 5, the heat conductive portions 140 which are equal to a plural number are arranged in the longitudinal directions of the wiring portions 130.

As indicated by thick broken lines, the LEDs 190 which are equal to 16 are arranged so as to bridge neighboring two wiring potions 130 in the lateral directions. As described, by connecting the LEDs 190 to the wiring portions 130 via the plating layers 160A, four LEDs are connected in series in the lateral directions. It is possible to connect the four LEDs 190, which are connected in series, to the wirings 130 to form four rows in parallel arranged in the longitudinal directions.

The protrusions 131 and 132 are formed in the two wiring portions 130A and 130E, respectively. The two wiring portions 130A and 130E are positioned on both ends of the arrangement of the five wiring portions 130A to 130E. The protrusions 131 and 132 are formed to protrude in the lateral directions so that the plating layers 160B1 and 160B2 are formed on the protrusions 131 and 132.

Therefore, when the positive terminal of the power source is connected to one of the plating layers 160B1 and 160B2 (see FIG. 3) formed on the two protrusions 131 and 132 and the negative terminal of the power source is connected to the other one of the plating layers 160B1 and 160B2, the four rows of the four LEDs 190, which are connected in series, can be connected in parallel to the power source.

Referring to FIGS. 8A to 12C, the manufacturing method of the printed wiring board 100 of the first embodiment is described.

FIGS. 8A to 13D are cross-sectional views of the printed wiring board 100 of the first embodiment for illustrating a process of manufacturing the printed wiring board of the first embodiment.

Figure 8A:
FIGS. 8A-8D are cross-sectional views of the printed wiring board of the first embodiment for illustrating a process of manufacturing the printed wiring board of the first embodiment.

Referring to FIG. 8A, the adhesive layer 120 is coated on the front surface (the upper surface in FIG. 8A) of the substrate 110. Instead of coating the adhesive layer 120, an adhesive film may be attached to the front surface of the substrate 110.

The substrate illustrated in FIG. 8A is wider than the substrate 110 in FIG. 2 on both side ends. Said differently, the substrate 110 protrudes right and left from the adhesive layer 120. The reason why the substrate 110 protrudes is to form sprocket holes on both side ends (to be described later). The longitudinal direction of the substrate 110 formed by a polyimide film is in a direction of penetrating the figure.

For example, the printed wiring board 100 can be manufactured by a reel-to-reel method using an insulative resin tape made of polyimide as a base material. Therefore, the substrate 110 in FIG. 8A illustrates a cross-sectional view of a part of a tape shaped substrate 113 illustrated in FIG. 10D illustrated later.

Figure 8B:
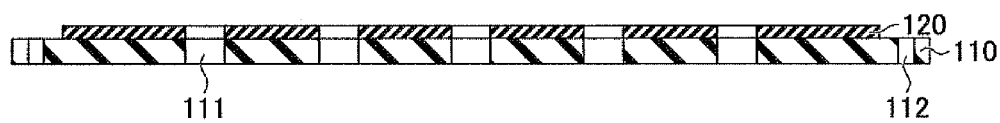

Referring to FIG. 8B, five through holes 111 and two sprocket holes 112 are formed by a punching process. The five through holes 111 penetrate both of the substrate 110 and the adhesive layer 120.

Figure 8C:
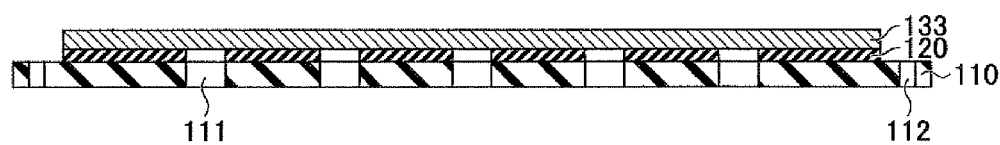

Next, as illustrated in FIG. 8C, a copper foil 133 is attached onto the adhesive layer 120. The thickness of the copper foil 133 is, for example, 18 to 35 μm. The copper foil 133 is patterned to be wiring portions.

Figure 8D:
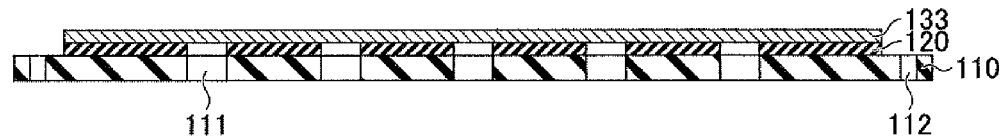

Referring to FIG. 8D, by impregnating the printed wiring board 100 with a solution for wet etching, portions of the lower surface of the copper foil 133 facing the through holes 111 and the upper surface of the copper foil 133 are etched. By etching the printed wiring board 100, an anticorrosive agent on the surface of the copper foil 133 is removed, and the surface of the copper foil 133 is slightly removed in the thickness direction (for example, 1 to 2 μm). The etching process may be performed when it is preferable to do so.

Figure 9A:
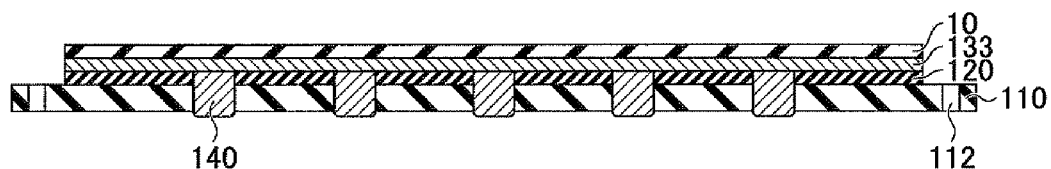
FIGS. 9A-9D are cross-sectional views of the printed wiring board of the first embodiment for illustrating the process of manufacturing the printed wiring board of the first embodiment.

Referring to FIG. 9A, a masking tape 10 is attached to the upper surface of the copper foil 133. The heat conductive portions 140 are grown during electro plating. A plated metal deposits on the back surfaces of the copper foil 133 which are exposed inside the through hales 111. Thus, the heat conductive portions 140 made of the plated metal are formed in columnar shapes. Before the heat conductive portions 140 are formed, the upper ends of the through holes 111 are blocked by the copper foil 133.

By filling the through holes 111 with the plated metal, the heat conductive portions in the columnar shapes are completed. For example, the heat conductive portions 140 may be formed as follows. Copper plating deposits on the back surfaces of the copper foil 133 by electro copper plating, and the through holes 111 are filled with copper plating.

The through holes 111 penetrate through both of the substrate 110 and the adhesive layer 120 thereby causing the back surfaces of the copper foil 133 to expose. Therefore, the heat conductive portions 140 penetrate through the substrate 110 and the adhesive layer 120, and are formed in a columnar shape.

The front surfaces of the heat conductive portions 140 in FIG. 9A are connected to the copper foil 133. The back surfaces of the heat conductive portions 140 in FIG. 9A are exposed on the back surface of the substrate 110. Referring to FIG. 9A, the back surfaces of the heat conductive portions 140 protrude from the back surface of the substrate 110.

The masking tape 10 covers the upper surfaces of the copper foil 133 to prevent a copper layer from growing on the upper surface of the copper foil 133 while the heat conductive portions 140 are grown with electro plating. The electro plating is performed by supplying electric power to the copper foils 133.

Figure 9B:
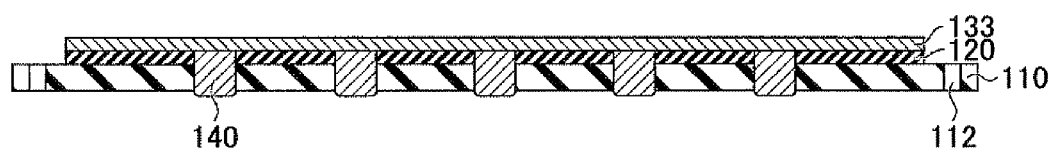

Next, referring to FIG. 9B, the masking tape 10 is removed.

Figure 9C:
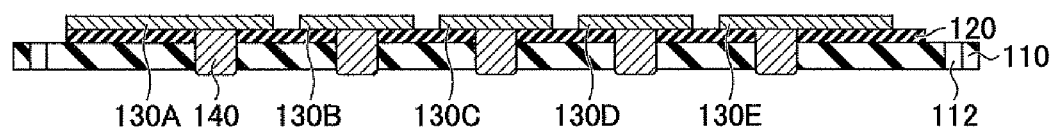

Next, a resist is coated on the copper foil 133 and exposed to light in conformity with the pattern of the wiring portions 130. Thus, the pattern of the wiring portions 130 is developed. By etching using the developed resist, the wiring portions 130 are formed (patterned) as illustrated in FIG. 9C. Referring to FIG. 9C, the developed resist is removed after patterning the wiring portions 130.

Figure 9D:
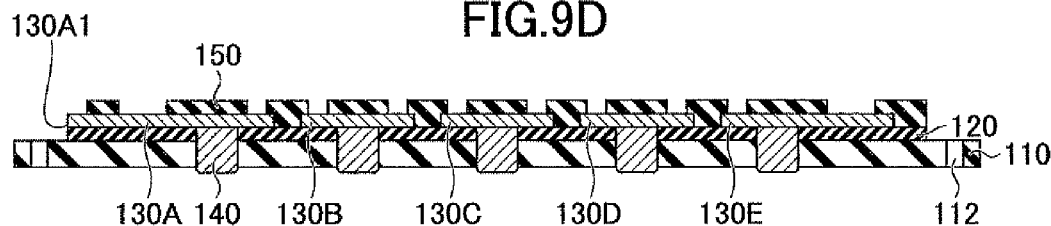

Referring to FIG. 9D, an insulating layer 150 is formed on predetermined portions of the wiring portions 130 where plating layers 160A and 160B are not to be formed. For example, if the insulating layer 150 is a white-colored ink, the insulating layer 150 may be formed by a screen printing method. If the insulating layer 150 is other than the white-colored ink, the insulating layer 150 may be formed by a method other than the screen printing method or the like.

As to the insulating layer 150, besides the screen printing method, the following method can be applied. After forming the insulating layer 150 to cover the wiring portions 130, there are formed opening portions in the insulating layer 150 through which the wiring portions 130 are exposed so that the plating layers 160A and 160B are formed on these.

Referring to FIG. 9D, by removing edges of the insulating layer 150 (the left edge of FIG. 9D), the end portion 130A1 of the wiring portion 130A is exposed on the wiring portions 130A. This is because the wiring portion 130A is supplied with electric power when the plating layers 160A and 160B are formed.

Figure 10A:
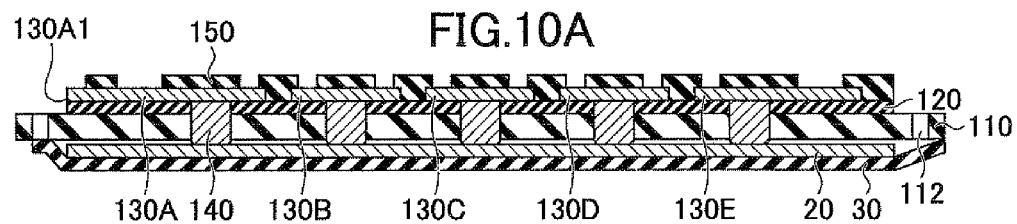
FIGS. 10A-10E are cross-sectional views of the printed wiring board of the first embodiment for illustrating the process of manufacturing the printed wiring board of the first embodiment.

Referring to FIG. 10A, a copper foil 20 and a masking tape 30, which is attached to the copper foil 20, are attached below the substrate 110. With this, the copper foil 20 contacts lower surfaces of the heat conductive portions 140. Thus, the lower surface of the substrate is completely covered by the masking tape 30.

For example, electric power is supplied to the end portion 130A1 which is not covered by the insulating layer 150 of the leftmost wiring portion 130 among the five wiring portions 130A to 130E. Under this state, the leftmost wiring portion 130A is connected to the other four wiring portions 130B to 130E via the copper foil 20. Therefore, by supplying electric power to the end portion 130A1 of the wiring portion 130, the wiring portions 130B to 130E are also supplied with electric power.

Figure 10B:
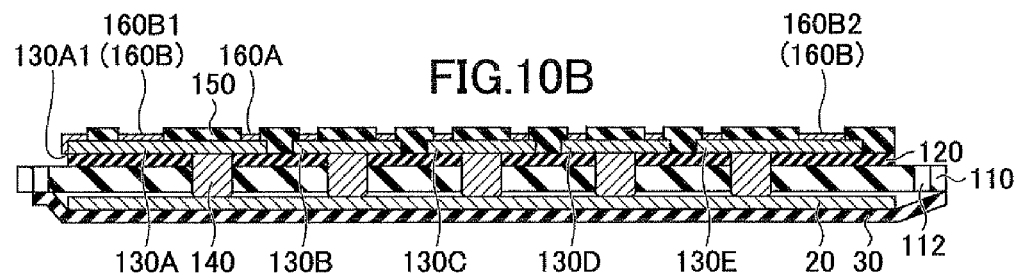

Therefore, under the state illustrated in FIG. 10A, electro plating is performed while supplying electric power to all of the wiring portions 130A to 130E via the end portion 130A1 of the wiring portion 130A. Thus, as illustrated in FIG. 10B, the plating layers 160A and 160B are formed. The plating layers 160A and 160B are formed by sequentially laminating a nickel (Ni) layer, and a gold (Au) layer in this order in the wiring portions 130. For example, a nickel layer, a palladium layer, and a gold layer may be sequentially formed in this order. A nickel layer and a silver layer are sequentially formed in this order. As described, another plating layer may be used.

Referring to FIG. 9D to FIG. 10B, by removing left side ends of the insulating layer 150, the end portion 130A1 of the wiring portion 130A is exposed on the insulating layer 150. Portions to which electric power is supplied are provided to form the plating layers 160A and 160B. These portions are not limited to the end portion 130A1 of the wiring portion and may be another portion for supplying electric power of the wiring portion 130A. Further, in addition to the wiring portions 130A to 130E, wirings, electrodes, or the like may be formed to supply electric power.

Said differently, as long as the electric power can be supplied to all wiring portions 130A to 130E via the masking tape 30, to which the copper foil is attached as illustrated in FIG. 10A by supplying electric power to any one of the wiring portions 130A to 130E, a portion where the electric power is supplied is not limited to the end portion 130A1 of the wiring portion 130A for forming the plating layers 160A and 160B.

As described, there is explained the process of forming the plating layers 160A and 160B in the electroplating while supplying power to the wiring portions 130A to 130E via the end portion 130A1 of the wiring portion 130A. However, if the end portion 130A1 of the wiring portion 130A1 is not exposed on the insulating layer 150, for example, the plating layers 160A and 160B may be formed by a method using a sparger.

Figure 10C:
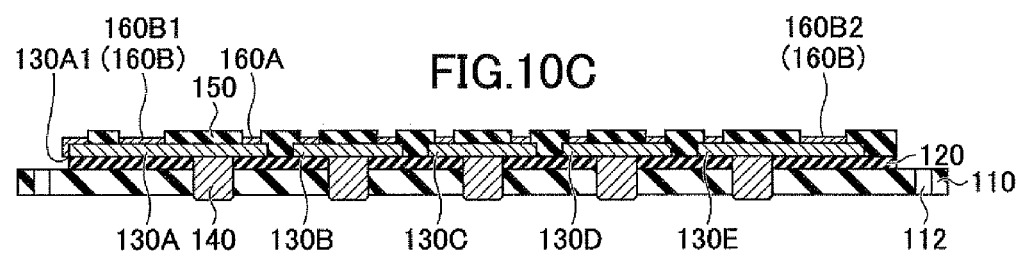
Figure 10D:
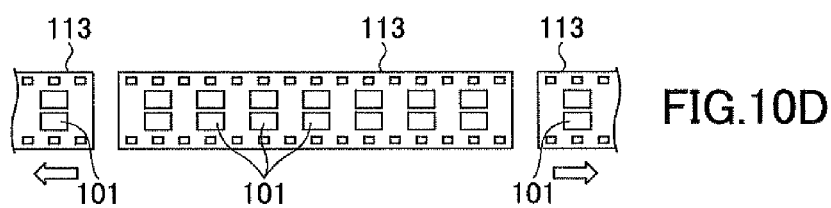

Next, referring to FIG. 10C, the masking tape 30 to which the copper foil 20 is attached is removed. With this, a portion of the printed wiring board 100 except for the adhesive layer 170 and the radiator plate 180 as illustrated in FIG. 2 is completed.

Next, referring to FIG. 10D, the tape shaped substrate 113 formed by the polyimide tape is cut in its longitudinal direction. Referring to FIG. 10D, the wiring portion to be a printed wiring board 100 is indicated by a reference symbol 101. The wiring portion 101 includes plating layers 160A which are equal to 32 and the plating layers 160B1 and 160B2 illustrated in FIG. 1. In the process illustrated in FIG. 10D, the tape shaped substrate 113 is cut so as to include the wiring portions 101 which are equal to 14.

Figure 10E:
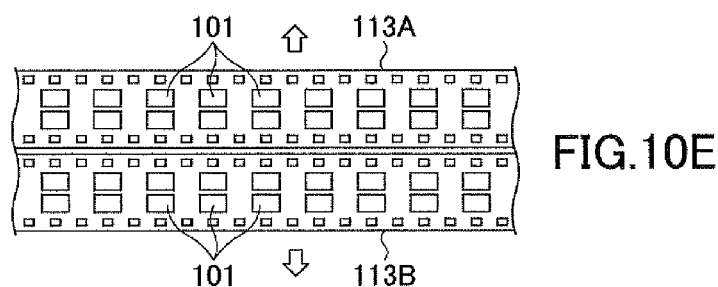

Referring to FIG. 10E, when the wiring portions 101 which are equal to 4 are formed in the width directions of the tape shaped substrate 113, the tape shaped substrate 113A and 113B are divided across the width directions. Then, the divided tape shaped substrates 113A and 113B may be divided across the longitudinal directions as illustrated in FIG. 10D.

Figure 11A:
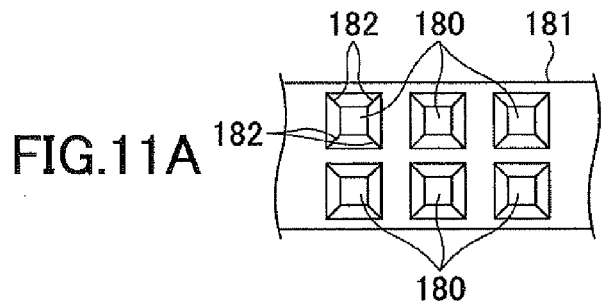
FIGS. 11A-11C are cross-sectional views of the printed wiring board of the first embodiment for illustrating the process of manufacturing the printed wiring board of the first embodiment.

Referring to FIG. 11A, a frame 181 on which plural radiator plates 180 are formed is prepared. The four corners of the radiator plate 180 are suspended by the frame 181 by wire-like connecting portions 182. The frame 181 may be formed by punching or etching a metallic material shaped like a hoop.

FIG. 11A illustrates a part of the frame 181 in the longitudinal direction where radiator plates 180 which are equal to 6 are formed. The frame 181 extends right and left along the tape shaped substrate 113 (see FIG. 10D).

Figure 11B:
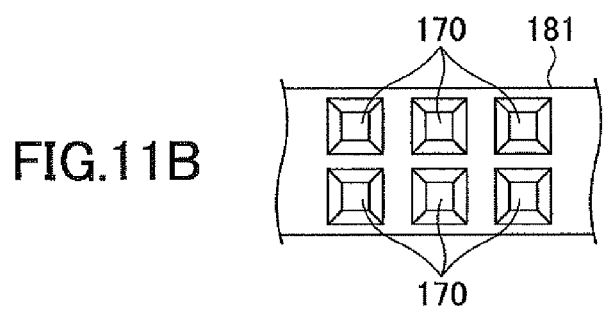
Figure 11C:
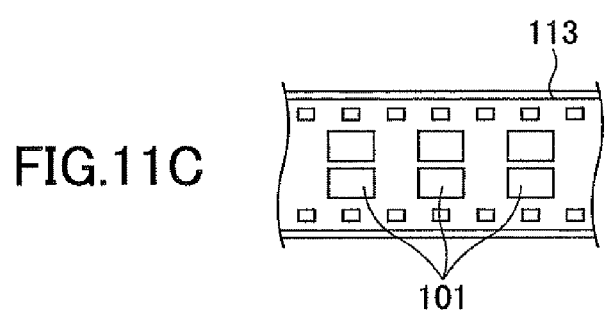

Referring to FIG. 11B, the adhesive layers 170 are coated on the radiator plates 180 formed in the frame 181. Referring to FIG. 11C, the tape shaped substrate 113 is attached onto on the frame 181. At this time, the adhesive layers 170 bond the radiator plates 180 to the tape shaped substrate 113. Instead of the adhesive layers 170, a glue film may be adhered to the radiator plates 180.

The adhesive layer 120, the wiring portions 130, the heat conductive portions 140, the insulating layers 150, and the plating layers 160A and 160B (see FIG. 2) are formed on the tape shaped substrate 113.

After the process illustrated in FIG. 11C, a punching process or a dicing process is performed to make plural printed wiring boards 100 (see FIGS. 1 to 3). At this time, the frame 181 is separated by cutting connecting portions 182.

Instead of dicing to form the printed wiring board 100, a sheet-like product containing plural wiring portions 101 may be shipped.

Referring to FIGS. 11A to 11C, the adhesive layers 170 may be previously formed on the radiator plates 180. Then, the radiator plates 180 are bonded to the tape shaped substrates 113. However, the adhesive layer 170 may be previously formed on the tape shaped substrate 113.

Figure 12A:
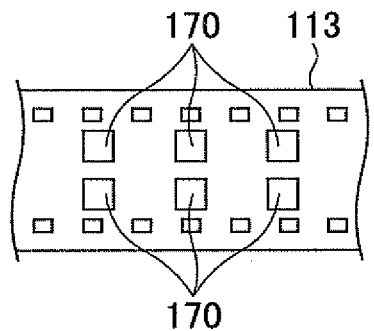
FIGS. 12A-12C are cross-sectional views of the printed wiring board of the first embodiment for illustrating the process of manufacturing the printed wiring board of the first embodiment.

Referring to FIG. 12A, the adhesive layers 170 may be formed on the back surface of the tape shaped substrate 113. Next, as illustrated in FIG. 12C, the frame 181 may be attached to the back surface of the tape shaped substrate. The adhesive layers 170 may be formed at positions corresponding to the wiring portions 101 (see FIG. 11C).

Figure 12B:
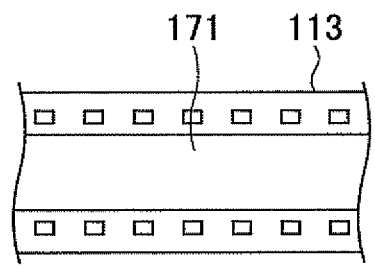
Figure 12C:
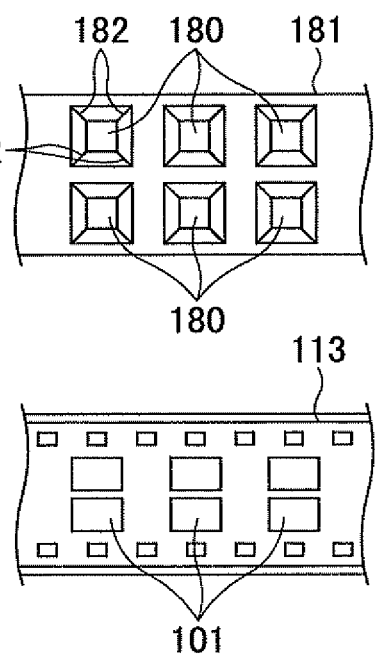

Referring to FIG. 12B, an adhesive layer 171 in a tape-like shape may be formed on the back surface of the tape shaped substrate 113. Next, as illustrated in FIG. 12C, the frame 181 may be attached to the back surface of the tape shaped substrate 113. An adhesive agent may be coated instead of the adhesive layer 171.

Referring to FIGS. 13A-13D, the radiator plate which has been previously diced may be attached to the back surface of the tape shaped substrate 113.

Figure 13A:
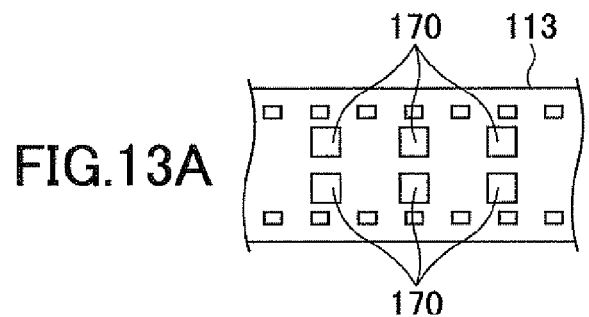
FIGS. 13A-13D are cross-sectional views of the printed wiring board of the first embodiment for illustrating the process of manufacturing the printed wiring board of the first embodiment.
Figure 13B:
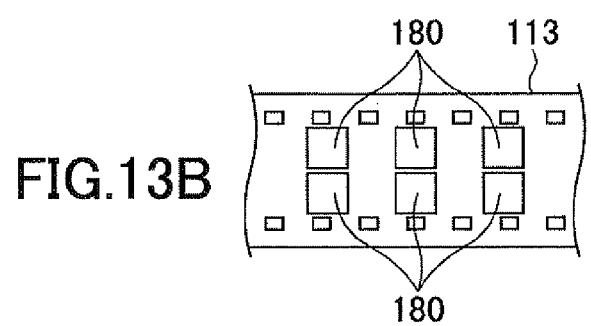

Referring to FIG. 13A, the adhesive layer 170 may be attached to the back surface of the tape shaped substrate 113. Next, as illustrated in FIG. 13B, the radiator plates 180 may be attached to the back surface of the tape shaped substrate 113. The adhesive layers 170 may be formed at positions corresponding to the wiring portions 101 (see FIG. 11C).

Figure 13C:
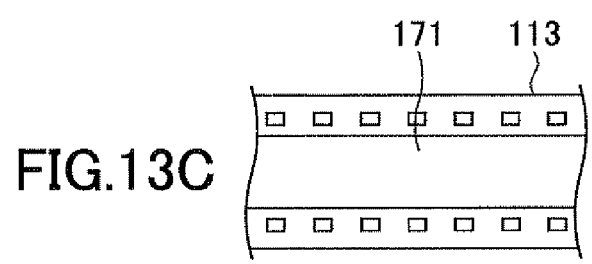
Figure 13D:
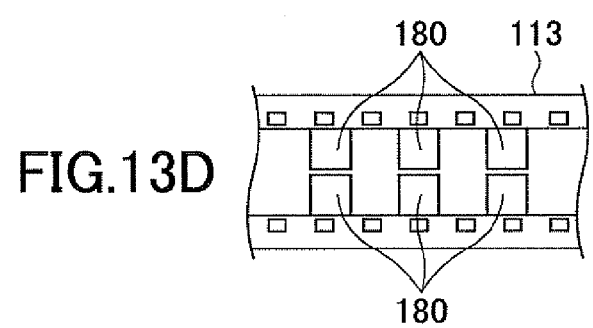

Referring to FIG. 13C, an adhesive layer 171 in a tape-like shape may be attached to the back surface of the tape shaped substrate 113. Next, as illustrated in FIG. 13D, the radiator plates 180 may be attached to the back surfaces of the tape shaped substrate 113. An adhesive agent may be coated instead of the adhesive layer 171.

After the process illustrated in FIGS. 13B and 13D, a punching process or a dicing process is performed to dice to make plural printed wiring boards 100 (see FIGS. 1 to 3).

Instead of dicing to form the printed wiring board 100, a sheet-like product containing plural wiring portions 101 may be shipped.

As described above, the printed wiring board 100 can be completely manufactured.

In the printed wiring board 100 of the first embodiment, the wiring portions 130 and the radiator plates 180 are thermally connected by the heat conductive portions 140. Since the heat conductive portions 140 are made of copper, heat conductivity is very high in comparison with the substrate made of polyimide. Further, the adhesive layers 170 for connecting the lower surfaces of the heat conductive portions 140 to the radiator plates 180 are an adhesive agent having high heat conductivity. Therefore, a thermal resistance between the heat conductive portions 140 and the radiator plates 180 can be reduced.

Therefore, in a case where the LEDs 190 are connected to the plating layers 160A, heat generated by the LEDs 190 can be efficiently conducted to the radiator plates 180 from the plating layers 160A via the heat conductive portions 140. Thus, the heat radiation property can be greatly improved.

Said differently, heat generated by the electronic parts connected onto one surface of the substrate can be efficiently conducted to the radiator plate 180 provided on the other surface of the substrate 110.

As described, according to the first embodiment, the heat generated by the electronic parts can be efficiently conducted to the radiator plate 180 provided on the other surface of the substrate 110. Thus, the printed wiring board 100 of which heat radiation property is greatly improved can be provided.

As described, the plating layers 160A are shaped like a semicircle in these plan views, and a circular electronic part element mounting portion is formed by a pair of plating layers 160A. However, the shapes of the plating layers 160A are not limited to shapes like the semicircle. For example, the shapes of the plating layers 160A may be like a rectangle or the like. In this case, the shapes of the electronic part element mounting portions formed by the paired plating layers 160A in these plan views may be like a rectangle or the like.

As described, a mode in which the wiring portions 130 are provided on the substrate 110 via the adhesive layer 120 has bee described.

However, the wiring portions 130 may be formed as follows. At first, the metallic layer is directly formed on the substrate 110 made of an insulative resin film or the like as the base material such as polyimide by electroless plating, sputtering, electro plating or the like using copper or the like. Next, through holes are formed by the laser processing or the like on the insulative resin film, and the heat conductive portions 140 are formed by electro plating using the metallic layer as the power supply layer. Thereafter, the metallic layer may be etched to form the wiring portions 130.

Further, the wiring portions 130 may be formed by a method different from the above methods. An insulative resin film is formed by coating an insulative resin such as polyimide on a metallic foil such as a copper foil. Next, the through holes are formed by laser processing or the like on the insulative resin film, and the heat conductive portions 140 are formed by electro plating using the metallic layer as the power supply layer. Thereafter, the metallic foil may be etched to form the wiring portions 130.

Figure 14:
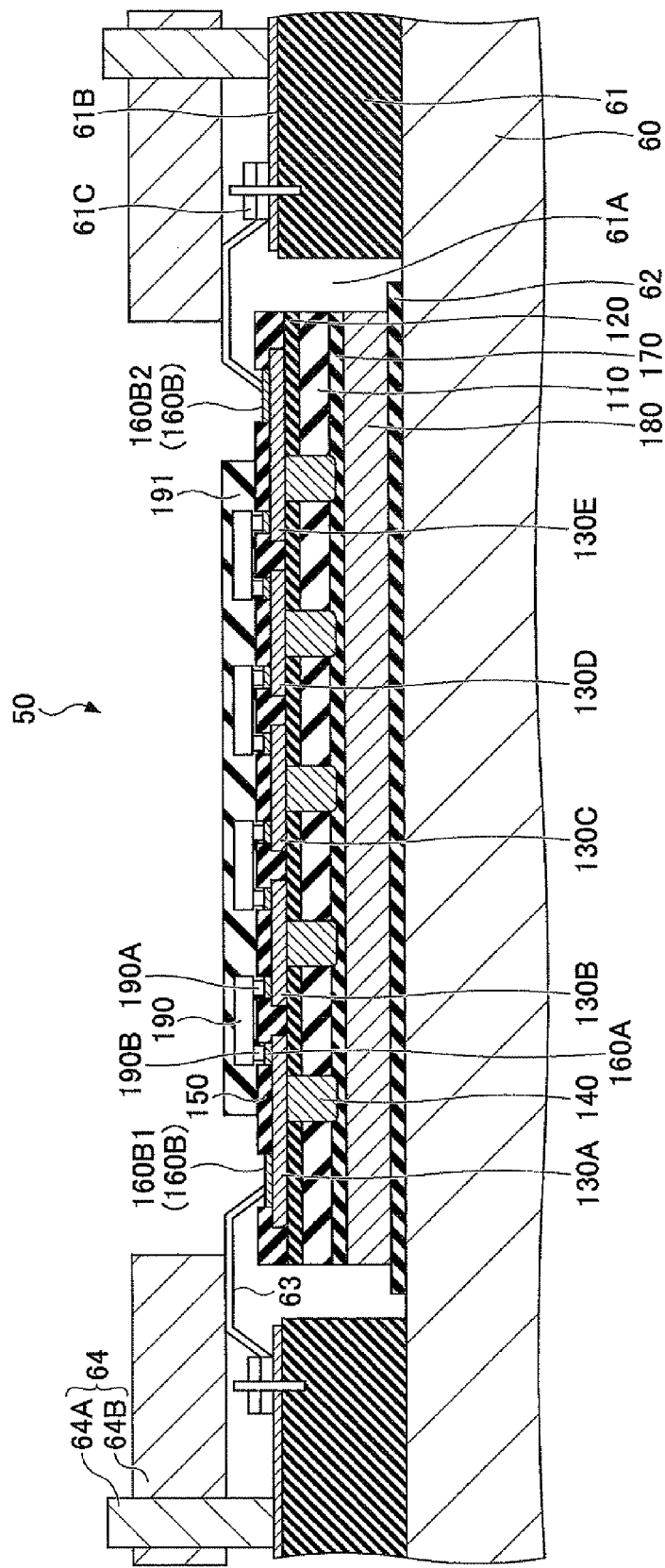
FIG. 14 is a cross-sectional view of a lighting device where a light-emitting device formed by mounting the LEDs on the printed wiring board of the first embodiment is mounted on the substrate of the lighting device.
Figure 15:
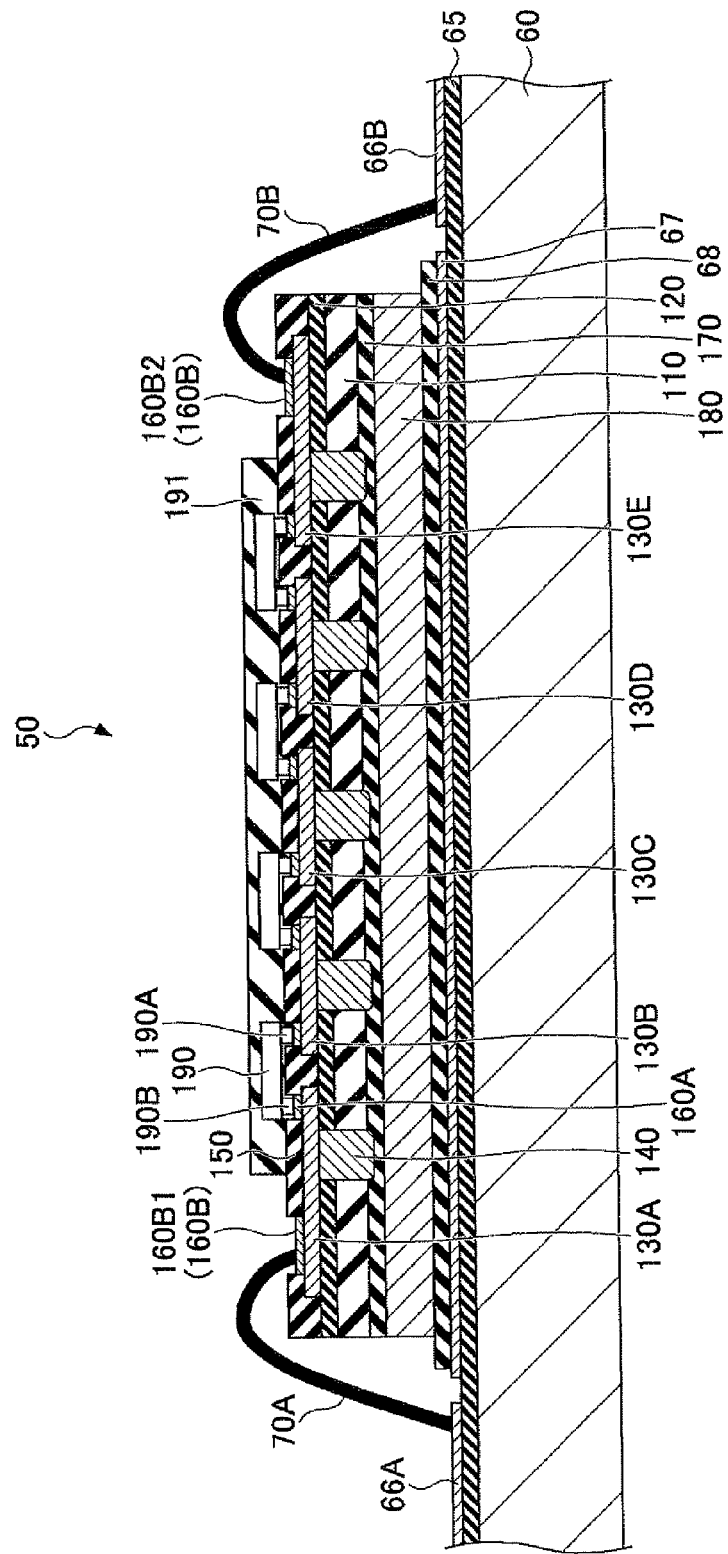
FIG. 15 is a cross-sectional view of a modified example of the lighting device where the light-emitting device formed by mounting the LEDs on the printed wiring board of the first embodiment is mounted on the substrate of the lighting device.

Referring to FIGS. 14 and 15, a structure of mounting the LEDs 190 on the printed wiring board 100 and the printed wiring board 100 is mounted on the substrate of the lighting device.

FIG. 14 is a cross-sectional view of a lighting device formed by mounting the LEDs 190 on the printed wiring board 100 of the first embodiment is mounted on the substrate of the lighting device.

The light-emitting device 50 is formed by mounting the LEDs 190 on the printed wiring board 100 and includes the printed wiring board 100, the LEDs 190, and the encapsulating resin 191.

The insulating plate 61 is arranged on the front surface of the basal plate 60 of the lighting device. The insulating plate 61 has an opening 61A. The insulating plate 61 also has a wiring 61B on its surface. The opening 61A is opened on the insulating plate 61 so as to have a rectangular shape in conformity with the size of the light-emitting device 50 in their plan views and penetrates through the insulating plate 61. A lead pin 63 is connected to the wiring 61B by a pin 61C.

The basal plate 60 may be a member having a high heat radiation property such as an aluminum plate-like member.

The light-emitting device 50 is mounted on a basal plate 60 via silicone grease 62 and inside the opening portion 61A of the insulating plate 61.

The lead pins 63 are provided right and left one each on the upper surface of the insulating plate 61. The lead pins 63 are connected to power input terminals of the lighting device.

A pressing mechanism 64 is provided on the insulating plate 61 so as to press the lead pins in a downward direction of the lead pin 63. The pressing mechanism 64 includes a rotary shaft 64A and a turning portion 64B. The turning portion 64B is attached to the insulating plate 61 via the rotary shaft 64A so that the tuning portion 64B is rotatable between a position above the lead pin 63 (illustrated in FIG. 14) and a position apart from the lead pin 63 by the rotary shaft 64A.

Therefore, by moving the turning portion 64B of the pressing mechanism 64 from the position apart from the lead pin 63 to the position illustrated in FIG. 14, the turning portion 64B can be pushed in the downward direction in FIG. 14 while the tip of the lead pin contacts the plating layer 160B.

With this, the light-emitting device 50 can be fixed to the basal plate 60, and electric power can be supplied to the LEDs 190 via the lead pins 63 and the plating layers 160B.

FIG. 15 is a cross-sectional view of a modified example in which the light-emitting device, formed by mounting the LEDs 190 on the printed wiring board 100, is mounted on the basal plate 60 of the lighting device.

Referring to FIG. 14, the pressing mechanism 64 is used to mount the light-emitting device 50 on the basal plate 60 of the lighting device as one mode. Referring to FIG. 15, the light-emitting device 50 may be connected to the basal plate 60 of the lighting device by the bonding wires 70A and 70B.

Referring to FIG. 15, the insulative layer 65, wirings 66A and 663 for power source and wiring 67 for radiation are formed on the upper surface of the basal plate 60.

The insulative layer 65 is provided to insulate the wirings 66A, 66B, and 67 from the basal plate 60 made of aluminum or the like. For example, the insulative layer 65 may be formed by a material which contains an epoxy adhesive and a ceramic filler.

The wirings 66A, 66B, and 67 may be formed by patterning the copper foil attached to the upper surface of the insulative layer 65.

The light-emitting device 50 is mounted on the basal plate 60 of the lighting device by connecting the radiator plate 180 to the wiring 67 via a bond 68. The bond 68 is preferably a bond having high heat conductivity such as silicone grease.

The pair of plating layers 160B1 and 160B2 of the light-emitting device 50 are connected to the wirings 66A and 66B for power source by the bonding wires 70A and 70B, respectively.

As described, the light-emitting device 50 can be fixed to the basal plate 60, and electric power can be supplied to the LEDs 190 via the bonding wires 70A and 70B and the plating layers 160B1 and 160B2.

Although the LEDs 190 are mounted in the printed wiring board 100 as the electronic part, the electronic parts are not limited to the LEDs 190. The electronic parts may be a light-emitting element such as a surface emitting laser.

Figure 16:
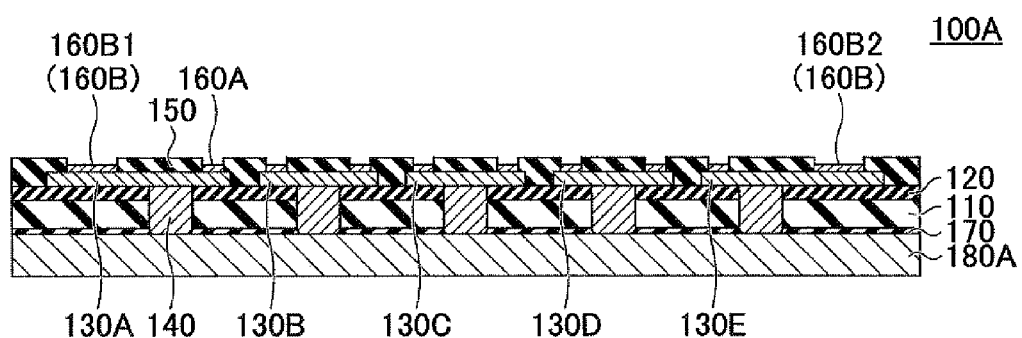
FIG. 16 is a cross-sectional view of a printed wiring board of a modified example of the first embodiment.

FIG. 16 is a cross-sectional view of a printed wiring board 100A of a modified example of the first embodiment.

The printed wiring board 100A differs from the printed wiring board 100 of the first embodiment illustrated in FIG. 2 as follows. The radiator plate 180A is made of insulative material, and the surfaces of the heat conductive portions 140 are directly connected to the radiator plate 180A without the intervening adhesive layer 170 therebetween.

The radiator plate 180A is a radiator plate made of a ceramic such as alumina or aluminum nitride or silicon. In a case where silicon is used, an insulative film such as an oxide film may be provided on the surface of the silicon. The radiator plate 180A made of the insulative material such as a ceramic may be connected to the wiring portions 130A to 130E via the heat conductive portions 140 without causing influences on electric potentials of the wiring portions 130A to 130E.

Therefore, when the radiator plate 180A made of the insulative material is used, the the adhesive layer 170 does not intervene between the heat conductive portions 140 and the radiator plate 180A so that the heat conductive portions 140 are directly connected to the radiator plate 180A. Said differently, the other surface (the lower surface in FIG. 16) of the heat conductive portions 140 is pushed by the radiator plate 180A so as to directly contact the surface of the radiator plate 180A.

As described, in a case where the heat conductive portions 140 are directly connected to the radiator plate 180A, the adhesive layer 170 may be previously patterned so as not to intervene between the heat conductive portions 140 and the radiator plate 180A.

Figure 17:
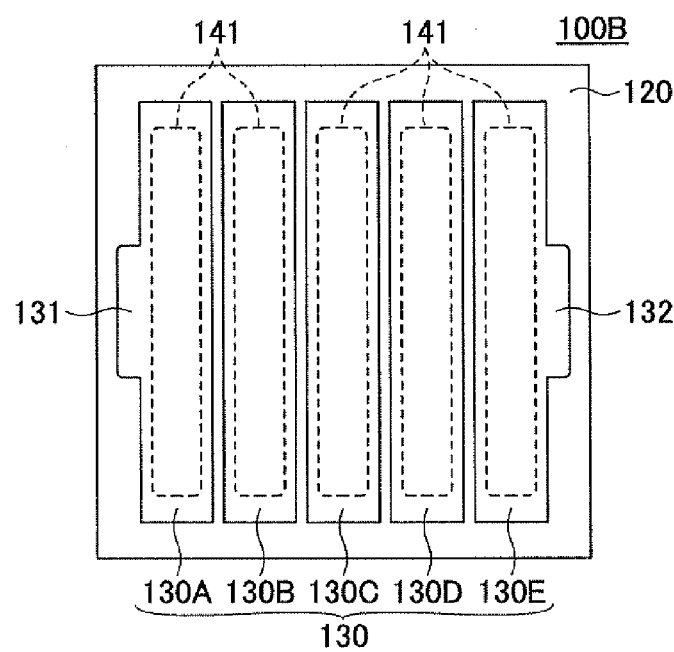
FIG. 17 is a cross-sectional view of a printed wiring board of another modified example of the first embodiment.

FIG. 17 is a cross-sectional view of a printed wiring board 100B of another modified example of the first embodiment. In a manner similar to FIG. 5, FIG. 17 illustrates the printed wiring board 100B from which the insulating layer 150 and the plating layers 160A and 160B are removed.

In the printed wiring board 100B, heat conductive portions 141 are shaped like a rectangle in this plan view. The printed wiring board 100B differs from the printed wiring board 100 of the first embodiment illustrated in FIG. 5 as follows. The heat conductive portions 141 are connected to the wiring portions 130A to 130E, respectively. In the printed wiring board 100 illustrated in FIG. 5, the shapes of the heat conductive portions 141 are circular. The heat conductive portions which are equal to 4 are connected to each of the wiring portions 130A to 130E.

Meanwhile, in the printed wiring board 100B, the heat conductive portions 141 which are equal to 5 are formed in the longitudinal directions of the wiring portions 130A to 130E on substantially entire areas where the plating layers 160A are formed (see FIG. 17), respectively. Said differently, the heat conductive portions 141 are formed on the areas where the heat conductive portions 140 are formed with respect to the wiring portions of the first embodiment with respect to the wiring portions 130A to 130E illustrated in FIG. 5, respectively.

As illustrated, the printed wiring board 100B including the heat conductive portions 141 in a long and thin rectangular shape, heat generated by electronic parts connected to the plating layers 160A can be efficiently conducted to the radiator plate 180 via the plating layers 160A, the heat conductive portion 141, and the adhesive layer 170. Therefore, heat radiation property can be greatly improved.

[b] Second Embodiment

Figure 18:
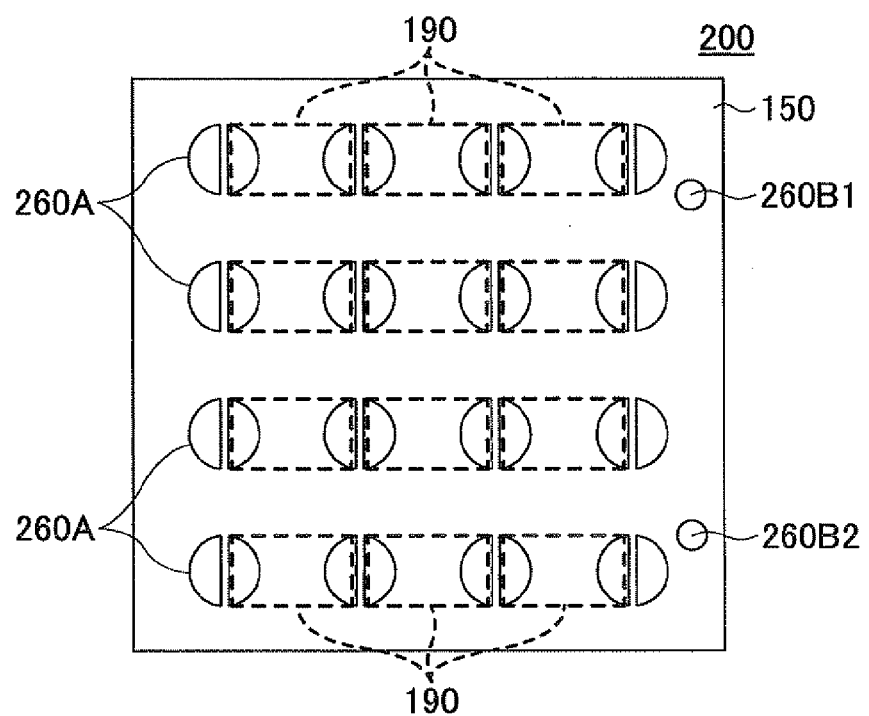
FIG. 18 is a plan view of a printed wiring board of a second embodiment.
Figure 19:
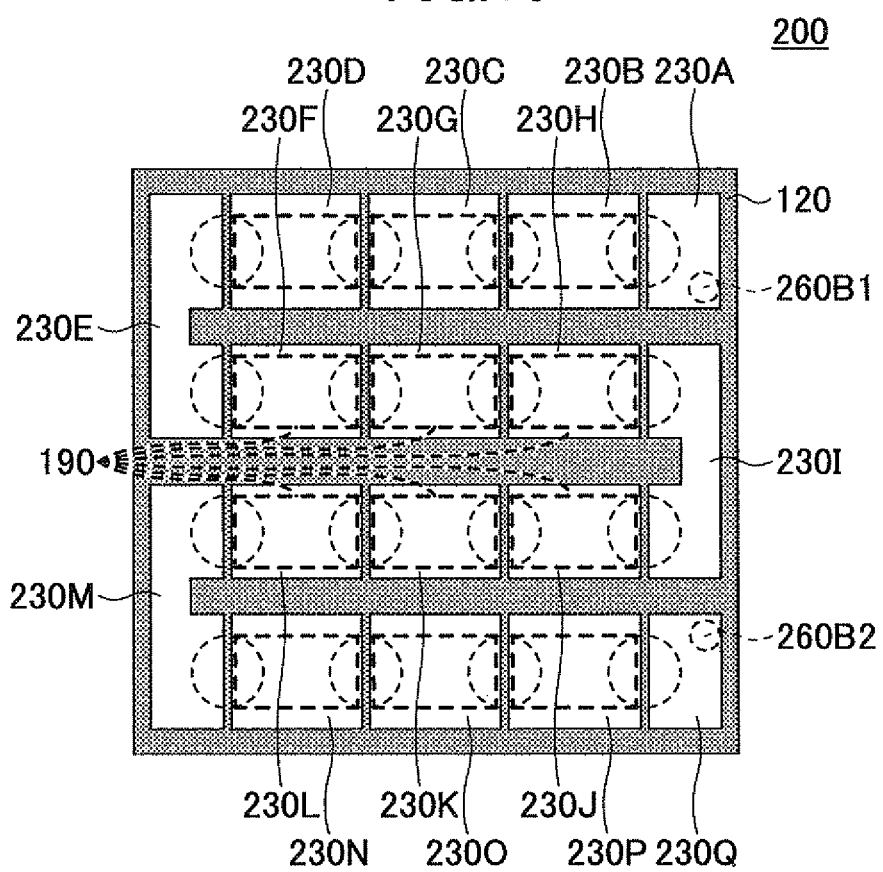
FIG. 19 is a cross-sectional view of the wiring pattern of a printed wiring board of the second embodiment.

FIG. 18 is a plan view of a printed wiring board of the second embodiment. FIG. 19 is a cross-sectional view of the wiring pattern of a printed wiring board of the second embodiment. FIG. 19 illustrates the pattern of wiring portions 230A to 230Q where the insulating layer 150 and the plating layers 260A, 260B1 and 260B2 are removed from FIG. 18.

The structure of the printed wiring board 200 of the second embodiment other than the above is similar to the printed wiring board 100 of the first embodiment. Therefore, the same reference symbols are attached to the same or similar constructional elements and description of these constructional elements is omitted.

Referring to FIG. 19, positions where the plating layers 260A, 260B1, and 260B2 arranged are illustrated by broken lines, and positions where the LEDs 190 connected are illustrated by heavy broken line.

In the printed wiring board 200, as illustrated in the plan view of FIG. 18, the plating layers 260A which are equal to 32 and the plating layers 260B1 and 260B2 are exposed on the insulting layer 150.

The plating layers 260A which are equal to 32 are arranged in a manner similar to the plating layers 160A which are equal to 32 illustrated in FIG. 1. The plating layers 260B1 and 260B2 are arranged on the right side end of FIG. 18.

Referring to FIG. 19, when the insulating layer 150 and the plating layers 260A, 260B1, and 260B2 are removed, the wiring portions 230A, 230B, 230C, 230D, 230E, 230F, 230G, 230H, 230I, 230J, 230K, 230L, 230M, 230N, 230O, 230P, and 230Q are formed on the adhesive layer 120.

The wiring portions 230A to 230Q are arranged as follows. The wiring portions 230A to 230D are linearly arranged from right to left. At the wiring portion 230E, the arrangement moves into the downward direction and further changes its direction. The wiring portions 230F to 230H are linearly arranged from left to right. At the wiring portion 230I, the arrangement moves into the downward direction and further changes its direction. The wiring portions 230J to 230P are arranged in a pattern similar to the wiring portions 230B to 230H. The arrangement ends at the wiring portion 230Q.

The plating layers 260A which are equal to 32 are formed in a manner similar to the plating layers 160A in a semicircular shape as in the first embodiment so as to form circles which are equal to 16 (see FIG. 18).

A pair of the plating layers 260A forming the circles which are equal to 16 are connected to different wiring portions 230A to 230Q.

The plating layers 260B1 and 260B2 are formed on the wiring portions 230A and 230Q, respectively.

Although it is not illustrated in FIG. 19, the heat conductive portions 140 are arranged below the wiring portions 230A to 230Q.

For example, in the printed wiring board 200 of the second embodiment, a positive terminal and a negative terminal of each electronic part are connected to each pair of the plating layers 260A, respectively. For example, the negative terminals and the positive terminals of the electronic parts are alternatively connected to the plating layers 260A which are equal to 32 formed on the wiring portions 230A to 230Q. The negative terminals and the positive terminals of the power source are connected to the plating layers 260B1 and 260B2, respectively. Thus, the electronic parts which are equal to 16 are connected to the power source between the plating layers 260B1 and 260B2 in series.

Therefore, in a case where the LEDs 190 are connected to the plating layers 260A of the printed wiring board 200 of the second embodiment, heat generated by the LEDs 190 can be efficiently conducted to the radiator plates 180 from the plating layers 260A via the heat conductive portions 140. Thus, the heat radiation property can be greatly improved.

As described, according to the second embodiment, the heat generated by the electronic parts connected on one surface of the substrate 110 can be efficiently conducted to the radiator plate 180 provided on the other surface of the substrate 110. Thus, the printed wiring board 200 of which heat radiation property is greatly improved can be provided.

FIG. 20 is a cross-sectional view of the wiring pattern of a printed wiring board of a modified example of the second embodiment. The wiring pattern of the printed wiring board 200A of the modified example of the second embodiment differs from the printed wiring board 200 illustrated in FIG. 19. The other structure of the modified example is similar to the printed wiring board 200 of the second embodiment.

Among wiring portions 330A to 330S which are equal to 19, the wiring portions 330A and 330S have protrusions 331 and 332, respectively. In the protrusion 331 and 332, in a manner similar to the protrusions 131 and 132 (see FIG. 3), plating layers connected to the power source (plating layers similar to the plating layers 160B1 and 160B2 of the first embodiment) are formed.

The wiring portions 330A to 330S which are equal to 19 are shaped like stripes. The wiring portion 330J has a length in the longitudinal direction substantially twice as long as the lengths of the other wiring portions in the longitudinal directions. The wiring portions 330A to 330I are arranged right to left. The wirings 330K to 330S are arranged from left to right on a side lower than the wiring portions 330A to 330I. The wiring portion 330J is arranged on the left side of the wiring portions 330I and 330K.

The wiring portions 330A to 330S have plating layers similar to the plating layer 260A in conformity with the positions where the electronic parts are mounted.

Although it is not illustrated in FIG. 20, the heat conductive portions 140 are arranged below the wiring portions 330A to 330S.

In the printed wiring board 200A of the modified example of the second embodiment, as indicated by broken lines in a rectangular shape, the positive terminals and the negative terminals of the electronic parts are connected to the plating layers (similar to the plating layers 260A) formed on the adjacent wiring portions 330A to 330S arranged in the lateral direction. By connecting the plating layers (similar to the plating layers 160B1 and 160B2 of the first embodiment) formed on the protrusions 331 and 332 to the positive terminal and the negative terminal of the power source, electric power may be supplied to many electronic parts from the power source.

Then, heat generated by the electronic parts can be efficiently conducted to the radiator plate 180 from the plating layers (similar to the plating layers 260A) via the heat conductive portions 140. Thus, heat radiation property can be greatly improved.

As described, according to the second embodiment, the heat generated by the electronic parts connected on one surface of the substrate 110 can be efficiently conducted to the radiator plate 180 provided on the other surface of the substrate 110. Thus, the printed wiring board 200A of which the heat radiation property is greatly improved can be provided.

There is provided a printed wiring board which can efficiently transfer heat generated by electronic parts, which are connected to one surface of the substrate, to a radiator plate disposed on another surface of the substrate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A printed wiring board comprising:
an insulative substrate;
a wiring portion which is formed on a surface of the insulative substrate and includes a plurality of wiring patterns each extending in a longitudinal direction and a lateral direction,
the wiring patterns being arranged in the lateral direction so that a predetermined gap is interposed between adjacent longitudinal sides, which are respectively included in the adjacent wiring patterns and extend in the longitudinal direction,
each of the wiring patterns including a plurality of terminals provided in the longitudinal direction,
the adjacent terminals of the adjacent wiring patterns, which are arranged in the lateral direction so as to face each other and interposed by the gap, forming a plurality of electronic part mounting portions, which are arranged in the longitudinal direction and on each of which a corresponding one of a plurality of electronic parts is mounted;
an insulative layer which is formed on the wiring patterns and through which the terminals of the wiring patterns are exposed;
a radiator plate provided on another surface of the insulative substrate; and
a plurality of heat conductive portions which are formed inside corresponding through holes penetrating through the surface and the other surface of the insulative substrate and connected to corresponding back surfaces of the wiring patterns of the wiring portion.
2. The printed wiring board according to claim 1, wherein openings of the through holes are closed by a back surface of the wiring portion,
the heat conductive portions are formed by filling the through holes with a metal.
3. The printed wiring board according to claim 1, wherein surfaces of the heat conductive portions protrude on the other surface of the insulative substrate.
4. The printed wiring board according to claim 1, wherein surfaces of the heat conductive portions are directly connected to a front surface of the radiator plate.
5. The printed wiring board according to claim 1, wherein surfaces of the heat conductive portions are connected to a front surface of the radiator plate via an adhesive layer.
6. The printed wiring board according to claim 1, wherein the heat conductive portions are a columnar member.

7. The printed wiring board according to claim 1, wherein the wiring patterns are shaped like a stripe, wherein the adjacent terminals of the adjacent wiring patterns are paired in forming the electronic part mounting portions.

8. The printed wiring board according to claim 1, wherein the wiring portion has another part exposed through the insulating layer as an electrode for connecting to a power source.

9. The printed wiring board according to claim 1, wherein the radiator plate is provided on the another surface of the insulative substrate via an adhesive layer.

10. The printed wiring board according to claim 1, wherein the insulative substrate is an insulative resin film.

11. The printed wiring board according to claim 1, wherein the insulative layer is a light reflective film.

12. The printed wiring board according to claim 1, wherein the electronic part mounting portions formed by the adjacent terminals of the adjacent wiring patterns are arranged in a grid-like pattern.

* * * * *